United States Patent [19]
Yun

[11] Patent Number: 5,918,117
[45] Date of Patent: Jun. 29, 1999

[54] METHOD FOR MANUFACTURING SEMICONDUCTOR DEVICE HAVING AN ESD PROTECTION REGION

[75] Inventor: Chan-su Yun, Euiwang, Rep. of Korea

[73] Assignee: Samsung Electronics, Co., Ltd., Suwon, Rep. of Korea

[21] Appl. No.: 08/937,545

[22] Filed: Sep. 25, 1997

[30] Foreign Application Priority Data

Sep. 25, 1996 [KR] Rep. of Korea ........................ 96-42690

[51] Int. Cl.⁶ .............................................. H01L 21/8238
[52] U.S. Cl. ............................................................ 438/200
[58] Field of Search ................................... 438/200, 201, 438/202, 211

[56] References Cited

U.S. PATENT DOCUMENTS

| | | | |
|---|---|---|---|
| 5,436,183 | 7/1995 | Davis et al. | 438/200 |
| 5,841,169 | 11/1998 | Beasom | 257/355 |

*Primary Examiner*—Charles Bowers
*Assistant Examiner*—Craig Thompson
*Attorney, Agent, or Firm*—Marger Johnson & McCollom, P.C.

[57] ABSTRACT

A method for forming an Electrostatic Discharge (ESD) protection circuit on a semiconductor device eliminates the formation of an ion-implanted well in the ESD protection circuit to lowering the impurity concentration of the well, thereby reducing the substrate resistance. Accordingly, the leakage current is reduced and snapback voltage characteristics are improved. The method includes forming a channel stop impurity layer over an entire peripheral circuit region of a substrate, including the ESD protection circuit region. A second, deeper, impurity layer is formed in a portion of the peripheral circuit region excluding the ESD protection circuit region, thereby forming one or more wells. A third impurity layer formed from impurities of a different type from the first impurity layer can be implanted in the portion of the peripheral circuit region so as to invert the polarity of a portio of the channel stop layer, thereby providing an active region for a complimentary transistor.

9 Claims, 9 Drawing Sheets

Fig. 1
*(PRIOR ART)*
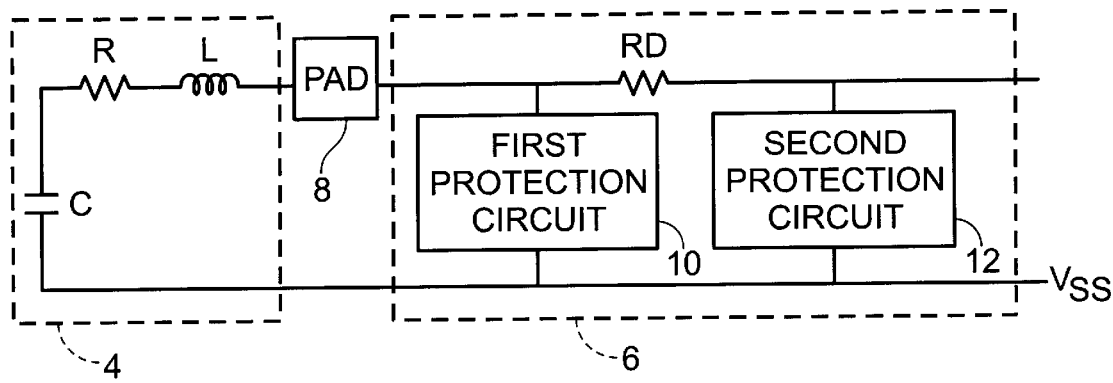
Fig. 2
*(PRIOR ART)*
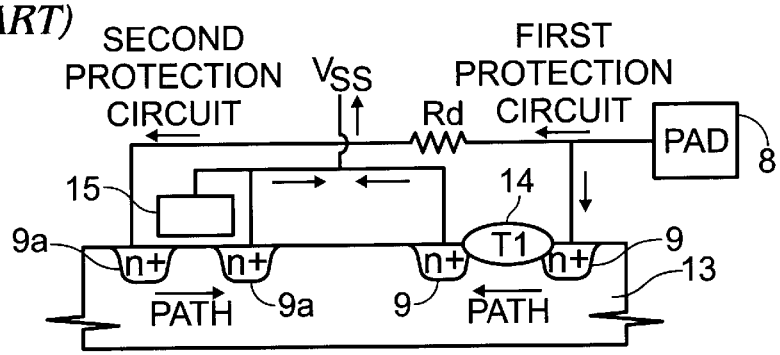
Fig. 3
TABLE 1. COMPARISON OF DIFFERENT GRADED JUNCTIONS
| SPLIT | S/D DOSE (cm$^{-2}$) | V(ESD) (VOLTS) | $I_{SUB}$ (uA/uM) | $I_{DSAT}$ (AM/um) | $V_{SP}$ (VOLTS) |
|---|---|---|---|---|---|
| A | $5*10^{14}$ PHOS100MIN | 3,600+200 | 1.36 | 0.138 | 12.8 |
| B | $5*10^{14}$ PHOS300MIN | 3,580+100 | 1.36 | 0.138 | 12.8 |
| C | $5*10^{14}$ PHOS+$2*10^{15}$AS100MIN | 5,175+55 | 1.81 | 0.143 | 10.0 |
| D | $1.2*10^{15}$ PHOS100MIN | 4,750+180 | 1.95 | 0.152 | 10.8 |
| E | $1.2*10^{15}$ PHOS300MIN | 5,040+180 | 2.26 | 0.167 | 10.0 | ns

METHOD FOR MANUFACTURING SEMICONDUCTOR DEVICE HAVING AN ESD PROTECTION REGION

BACKGROUND OF THE INVENTION

1. Field of the Invention

The present invention relates to a method for manufacturing a semiconductor device, and more particularly, to a method for forming an ESD (Electrostatic Discharge) protection region on a semiconductor device.

2. Description of the Related Art

A semiconductor device, such as a memory circuit, commonly includes an ESD protection circuit. A semiconductor device could be damaged by momentarily high voltage applied through a pad layer. A momentary high voltage that is made by a human body or a machine is called as ESD (ElectroStatic discharge). An ESD protection circuit is provided for preventing a memory device from being damaged by the ESD. An ESD protection circuit is usually formed near a bonding pad on a peripheral circuit region in a semiconductor device.

FIG. 1 shows a conventional ESD equivalence signal circuit 4 and a conventional ESD protection circuit 6 with a bonding pad 8 in a semiconductor device. Here, the ESD equivalence signal circuit 4, a typical RLC circuit, includes resistance "R", reactance "L" and a capacitor "C". The ESD protection circuit 6 includes first and second protection circuits 10 and 12 and a diffusion resistance Rd disposed between the first and second protection circuits 10 and 12.

The first and second protection circuits 10 and 12 should operate within an extremely short time in order to reduce any overload applied to an internal circuit of the semiconductor device. The first protection circuit 10, which is a protection means as shown in FIG. 2, includes a field oxide film 14. The second protection circuit 12 includes a transistor having a thin gate oxide film between a gate electrode 15 and a semiconductor substrate 13.

Referring to FIG. 2, in the first protection circuit, the overload applied to a pad is removed using a bipolar snapback conduction phenomenon generated between n$^+$ doping regions 9 through the semiconductor substrate 13. However, if the overload is not completely removed from the first protection circuit, the overload is drawn to the supply voltage Vss by a bipolar conduction phenomenon generated between n$^+$ doping regions 9a of the second protection circuit through the semiconductor substrate 13. Accordingly, in the ESD protection circuit, it is important to use an optimal diffusion resistance "Rd" between the first and the second protection circuits and to optimize the size and drain structure of the device forming the second protection circuit. To address the above-described necessity, a conventional technology developed by C. Duvvury et.al has been announced under the title of "ESD phenomena in graded junction device" from IEEE/IRPS 1989.

In most conventional methods, the ESD characteristic is proved through drain engineering or the reduction of the gate length to reduce the width of a base during bipolar operation.

FIG. 3 is a table showing how the characteristics of an ESD protection circuit vary according to the doping concentration of a source and drain region, i.e., an ESD voltage, substrate current, drain saturation current and snapback voltage. Referring to the table, doping of the source/drain region is divided into five grades of A to E, where the doping concentration increases from grade A to grade E. As the doping concentration increases, the snapback voltage, i.e. the voltage at which the snapback phenomenon begins, is reduced by 16~22% from a maximum of 12.8V to a minimum of 10.0V. Also, the ESD voltage V(ESD) is increased by 24~30% from the minimum of 3,600±200V to the maximum of 5,175±55V. However, undesirable leakage substrate current is increased by 25~35% from 1.36 $\mu A/\mu M$ to the maximum 2.26 $\mu A/\mu M$. The saturation current of a MOS transistor, Idsat, is in an acceptable range.

FIG. 4 is a graph showing each snapback voltage in the cases of grade A and grade C, where the symbol "■" represents grade A and the symbol "□" represents grade C. Referring to FIG. 4, it can be seen that grade C, which has a doping concentration that is relatively higher than that of grade A, has a snapback voltage that is lower than that of grade A.

A conventional method for forming an ESD protection circuit region will be described in detail with reference to the accompanying drawings.

FIGS. 5 through 7 are sequential views showing a conventional method for manufacturing a semiconductor device. FIG. 5 shows a portion of a semiconductor memory circuit including a cell array region and peripheral circuit region. Region "A" forms an ESD protection circuit and a region "B" is a typical peripheral circuit region where NMOS transistors and PMOS transistors are to be formed. First, the semiconductor substrate 16 is divided into the typical peripheral circuit region "B", the ESD protection region "A", and the cell array region (not shown). Next, each region of the semiconductor substrate 16 is defined by an active region and a nonactive region, i.e., a field region, and then a field oxide film 18 is formed on the field region. The field oxide film can be formed as any one of a LOCOS type, a trench type, a SEPOX type and so on. The field oxide film 18 is formed, and then a thin buffer oxide film 20 is grown on the entire surface of the semiconductor silicon substrate 16.

FIG. 6 shows a step of forming a P-well on the ESD protection region "A" and typical peripheral circuit region "B". First, a first mask pattern 22 is formed on a semiconductor substrate 16. The first mask pattern 22 defines a region where an NMOS transistor is to be formed on the peripheral circuit region B. Next, impurities of P-type conductivity are ion-implanted into the entire surface of the resultant structure with energy enough to form an impurity layer under the field oxide film 18. As a result, a deep first impurity layer 24, i.e., a P-well, is formed in a portion of the semiconductor substrate 16 exposed by the first mask pattern 22. Then, impurities of P-type conductivity are ion-implanted into the semiconductor substrate 16 to form a second impurity layer 26, i.e., an N-field (P-type) channel stop region shallower than the depth of the P-well. At this stage, the second impurity layer 26 is formed with a doping concentration of about $1 \times 10^{17}$ atoms/cm$^3$.

Then, impurities of P-type conductivity are ion-implanted in order to control the threshold voltage of a MOS transistor, to thereby form a third impurity layer 28 which is shallower than the depths of the first and second impurity layers 24 and 26. The depth of the third impurity layer 28 is kept shallow by using a low implantation energy. Accordingly, the third impurity layer 28 exists only in the active region between the field oxide films 18.

An NMOS transistor is formed on a portion of the semiconductor substrate 16 not masked by the first mask pattern 22. The order for forming the first, second and third impurity layers 24, 26 and 28 can be changed.

FIG. 7 shows a step of forming an N-well where a PMOS transistor is to be formed. First, the first mask pattern 22 of FIG. 6 is removed. Then, a second mask pattern 30 is formed on the semiconductor substrate 16 for defining the ESD protection circuit region "A" and a region where the P-well is formed. Impurities of an N-type conductivity are ion-implanted with high energy into the region of senmiconductor substrate 16 exposed by the second mask pattern 30. A deep fourth impurity layer 32, i.e., an N-well, is formed in the semiconductor substrate 16 on the region exposed by second mask pattern 30. The impurities used for forming the fourth impurity layer 32 are implanted with high enough energy to pass through the field oxide film 18. Accordingly, the fourth impurity layer 32 exists under the field region of the portion which is not masked by the second mask pattern 30 as well as the active region thereof.

Impurities of N-type conductivity are subsequently ion-implanted, to thereby form a fifth impurity layer 34 of N-type conductivity, i.e., a P-field channel stop region, which is shallower than the depth of the fourth impurity layer 32. The fifth impurity layer 34 is formed deeply under the active region of the semiconductor substrate 16, while formed shallowly under the field oxide film 18 of the field region. Next, a sixth impurity layer 36 is formed shallower than the depth of the fifth impurity layer 34, only on an active region of the semiconductor substrate 16. The sixth impurity layer 36 controls the threshold voltage of the transistor. Next, the second mask pattern 30 is eliminated, and then transistors are formed on each region of the semiconductor substrate 16 in the usual manner.

As described above, in an ESD protection circuit region formed by a conventional method, the length of the gate can be reduced when the transistor is formed, thereby increasing the ESD voltage. However, when the first to third impurity layers 24, 26 and 28 of FIG. 7 are formed, the resistance of the substrate decreases due to the increase in impurity concentration in the substrate, and thus, the leakage current increases.

SUMMARY OF THE INVENTION

Accordingly, it is an object of the present invention to provide a method for manufacturing a semiconductor device which increases the resistance of the substrate to improve the operational characteristics of an ESD protection circuit and to reduce leakage current.

A semiconductor substrate can be defined as a core circuit region and a peripheral circuit region including an ESD protection circuit region. The present invention contemplates a method for manufacturing a semiconductor circuit for increasing the resistance of the substrate to improve the operational characteristics of the ESD protection circuit and to prevent leakage current. A method for manufacturing a semiconductor device in accordance with the present invention is as follows.

A buffer oxide film is formed on the entire surface of a semiconductor substrate having field oxide films. A first impurity layer for the purpose of forming a P-well is formed on a portion of a typical peripheral circuit region excluding an ESD protection circuit region. A second impurity layer for channel stop of an n-field is formed on said peripheral circuit region including an ESD protection circuit region. The second impurity layer is formed shallower than the depth of said first impurity layer. A third impurity layer having a predetermined thickness is formed under active regions between said field oxide films of semiconductor substrate. A fourth impurity layer for the purpose of forming an N-well is formed on a portion, where said first impurity layer is not formed, of the cell array region and said typical peripheral circuit region. A fifth impurity layer for the channel stop of a p-field is formed on a region of said fourth impurity layer where said second impurity layer is formed. The dose amount of the fifth impurity layer is bigger than that of said second impurity layer, so as to invert the conductivity type of that region. A sixth impurity layer is formed on an active region of said fourth impurity layer of said semiconductor substrate. Then, transistors are formed on said active regions.

Another method for manufacturing a semiconductor device in accordance with the present invention is as follows.

A first impurity layer for an n-field channel stop is covered on said active region and said field region of said peripheral circuit region including the ESD protection circuit region. A second impurity layer shallower than the depth of said first impurity layer is formed on the active region between said field oxide films of said semiconductor substrate. A third impurity layer for a P-well deeper than said first impurity layer is formed on a portion of said typical peripheral circuit region of said semiconductor substrate. A fourth impurity layer for a p-field channel stop is formed on said third impurity layer. A fifth impurity layer for controlling a threshold voltage of a PMOS transistor is formed on an active region between said field oxide films. A transistor is formed on an active region of said semiconductor substrate.

According to the present invention, the concentration of impurities implanted into the ESD protection circuit region is reduced. Accordingly, the resistance of the substrate under the ESD protection region is increased in comparison to the prior art. This increases the forward voltage between a source and the substrate during a bipolar conduction mode of the ESD protection circuit and reduces the snapback voltage. Thus, operational characteristics of the ESD protection circuit can be improved and leakage current can be reduced.

BRIEF DESCRIPTION OF THE DRAWINGS

The above objects, features and advantages of the present invention will become more apparent by describing in detail a preferred embodiment thereof with reference to the attached drawings in which:

FIG. 1 is a circuit diagram of a typical prior art ESD equivalence signal and protection circuit;

FIG. 2 is a pictorial and circuit diagram of first and second protection circuits for forming the ESD protection circuit of FIG. 1;

FIG. 3 is a table showing prior art ESD protection circuit characteristics;

DETAILED DESCRIPTION OF THE INVENTION

Hereinafter, methods for forming an ESD protection circuit of a semiconductor circuit device according to first and second embodiments of the present invention will be described in detail with reference to the accompanying drawings. Also, ESD properties in an ESD protection circuit region formed according to the present invention will be described in detail with reference to the accompanying drawings. The first embodiment of the present invention will be described first.

Figure 8:
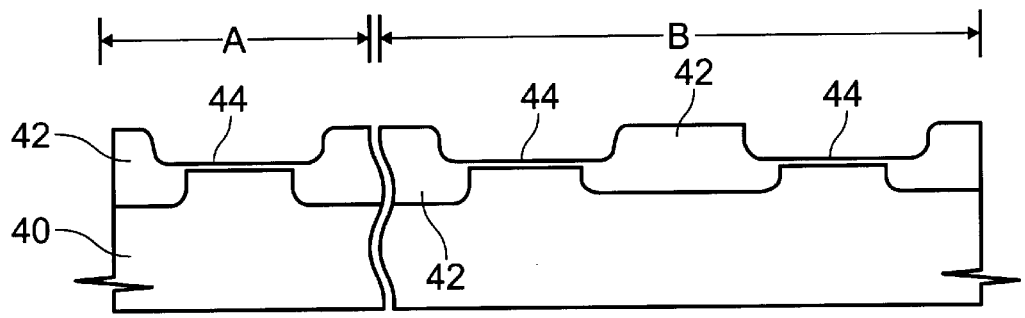
FIGS. 8 through 11 are sectional views showing sequential steps of a method for manufacturing a semiconductor device according to a first embodiment of the present invention.

Referring to FIG. 8, a semiconductor substrate 40 is divided into a cell array region (not shown) and a peripheral circuit region. The peripheral circuit region is divided into an ESD protection circuit region "A" and a typical peripheral circuit region "B". Next, each region of the semiconductor substrate 40 is divided into an active region and a nonactive region, i.e., a field region. Then, a field oxide film 42 is formed on the field region. The field oxide film 42 can be formed with any one of a LOCOS type, a trench type, a SEPOX type or any other isolation technique. A sacrificial oxide film 44 is formed on the entire surface of the semiconductor substrate 40 having field oxide films to a thickness such that a subsequent process of ion-implantation is not influenced. The sacrificial oxide film 44 is for preventing the surface of the semiconductor substrate 40 from being damaged during the subsequent ion-implantation process.

Figure 9:
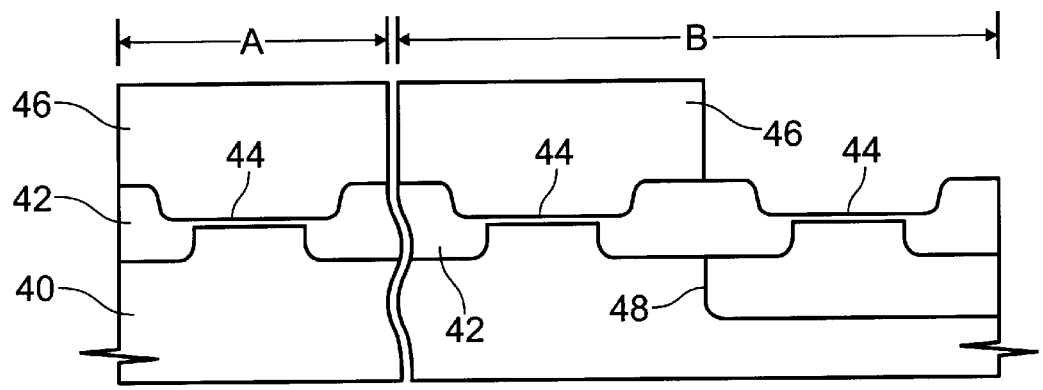

FIG. 9 shows the step of forming a first impurity layer 48 on a portion of the peripheral circuit region. A first mask pattern 46 for defining a P-well is formed on the semiconductor substrate 40. The ESD protection circuit region "A" is covered with the first mask pattern 46 at this time. The first mask pattern 46 is typically formed by a photoresist mask. Then, impurities of P-type conductivity are ion-implanted into the entire surface of the semiconductor substrate 40 to form a first impurity layer 48 in a region which is not masked by the first mask pattern 46. The first impurity layer 48 is formed deeply under the field region as well as the active region. Accordingly, ion-implantation energy of the impurities of P-type conductivity should be high enough to penetrate the thickness of the field oxide film 42.

Figure 10:
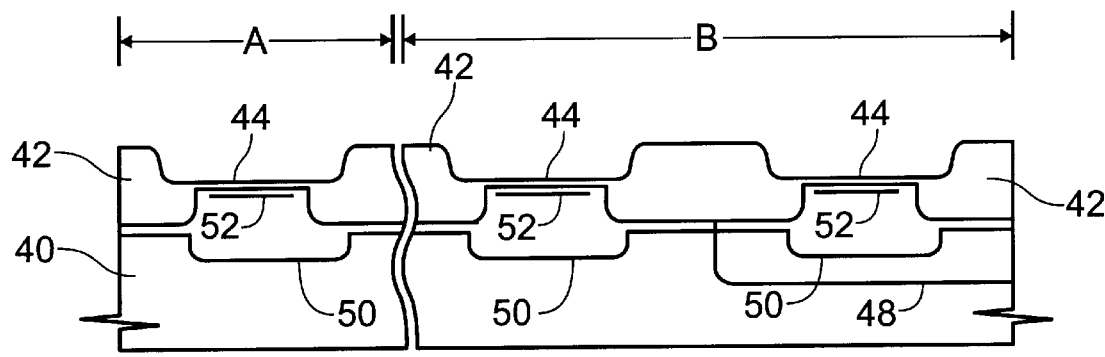

FIG. 10 shows the steps of forming second and third impurity layers 50 and 52. The first mask pattern 46 is eliminated from the semiconductor substrate 40 after the first impurity layer 48 is formed. A second impurity layer 50 is formed on said peripheral circuit region including an ESD protection circuit region. The second impurity layer is formed by ion-implanting impurities of P-type conductivity into the entire surface of the semiconductor substrate 40 with enough energy to pass through the field oxide film 42 and to form a second impurity layer 50 having a predetermined depth under the field oxide film 42. Here, the ion-implantation energy for forming the second impurity layer 50 should be lower than that for forming the first impurity layer 48 so that the second impurity layer 50 is formed between the field oxide film 42 and the first impurity layer 48. Also, in the field region, the second impurity layer 50 under the field oxide film 42 is shallow. However, in the active region, there is no barrier such as the field oxide film 42. Accordingly, the second impurity layer 50 in the active region is deeper than in the field region. The second impurity layer 50 is for a channel stop. The second impurity layer 50 exhibits the effects of the channel stop only in the field region, and improves the punch-through property between a source and a drain of a transistor to be formed in the active region.

Next, in order to control the threshold voltage of the NMOS transistor, the impurities of P-type conductivity are ion-implanted into the entire surface of the resultant structure with energy lower than that for forming the second impurity layer 50. As a result, a third impurity layer 52 shallower than the depth of the second impurity layer 50 is formed in the active region. The impurities ion-implanted into field oxide layer do not affect device operation.

Figure 11:
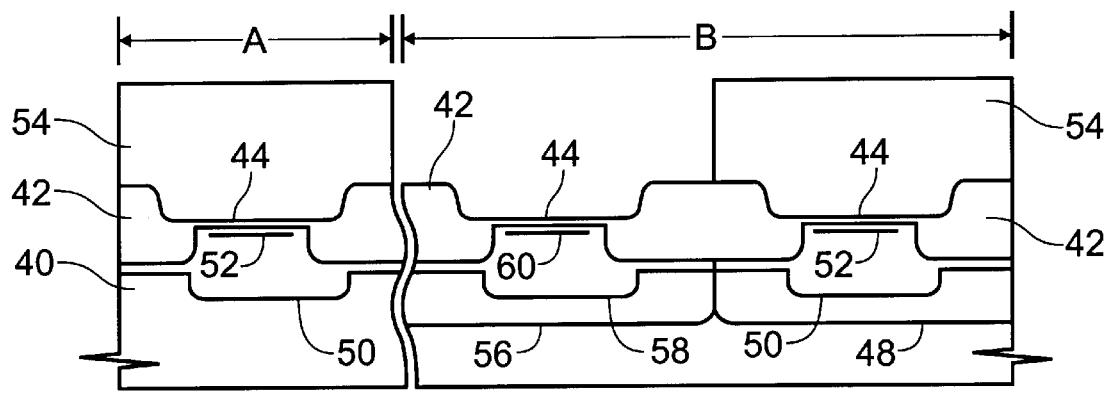

FIG. 11 shows the steps of forming fourth, fifth and sixth impurity layers 56, 58 and 60 in the PMOS transistor region. A second mask pattern 54 for defining the N-well region to be formed on the semiconductor substrate 40. Then, impurities of N-type conductivity are ion-implanted into the entire surface of the semiconductor substrate 40 into regions where the second mask pattern 54 exposes the substrate surface to form the fourth impurity layer 56 having the same depth as that of the first impurity layer 48. In order to form a channel stop on the PMOS region, a fifth impurity layer 58 is formed by ion-implanting impurities of N-type conductivity into the exposed areas of the entire surface of the semiconductor substrate 40. The fifth impurity layer 58 is formed under the field oxide film 42, and accordingly, the ion-implantation energy should be high enough that the impurities of N-type conductivity can pass through the field oxide film 42. Since the second impurity layer 50 is formed of impurities of P-type conductivity, the dose of the impurities of P-type conductivity in the second impurity layer 50 is less than that of the second impurity layer 50 under the field. Accordingly, the dose of the impurities of N-type conductivity used for forming the fifth impurity layer 58 should be enough to compensate for the dose implanted in the second impurity layer 50. Also, the fifth impurity layer 58 on the active region is formed to be deeper than that under the field region, but not, however, deeper than that of the fourth impurity layer 56.

Also, a sixth impurity layer 60 for controlling the threshold voltage in the PMOS transistor is formed. Impurities of N-type conductivity are ion-implanted to the same depth as the third impurity layer 52. Because the impurities of P-type conductivity for the formation of the third impurity layer 52 were previously implanted into the region in which sixth impurity layer 60 is to be formed, the dose of the impurities of N-type conductivity should be greater than that of the third impurity layer 52. Then, the second mask pattern 54 is stripped from the semiconductor substrate 40, and transistors are formed in active regions in a conventional manner.

Figure 12:
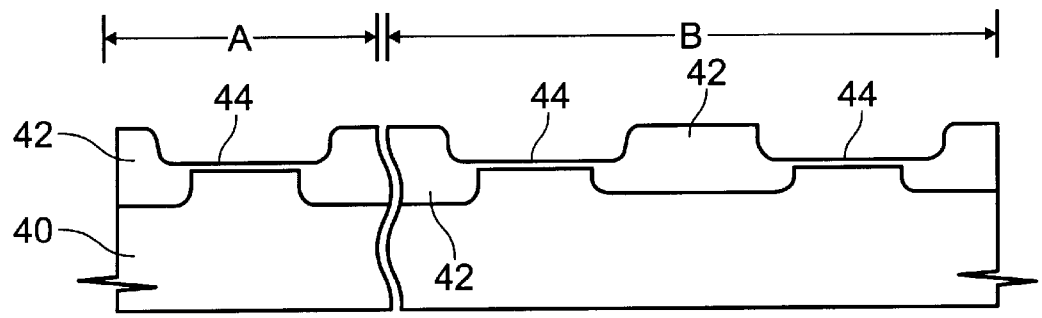
FIGS. 12 through 14 are sectional views showing sequential steps of a method for manufacturing a semiconductor device according to a second embodiment of the present invention.

A method of manufacturing a semiconductor device according to a second embodiment of the present invention, will now be described. Here, the same reference characters as those of the first embodiment indicate the same regions as those of the first embodiment. Referring to FIG. 12, a semiconductor substrate 40 having P-type conductivity is divided into a cell array region (not shown) and a peripheral circuit region. The peripheral circuit region is divided into an ESD protection circuit region "A" and a typical peripheral circuit region "B".

Then, to divide the cell array region and the peripheral circuit region into active regions and field regions, a field oxide film 42 is formed in the field regions of the semiconductor substrate 40. The field oxide film 42 can be formed in anyone of a LOCOS type, a trench type, a SEPOX type and so on. The resultant structure is thermally oxidized and then a sacrificial oxide film 44 is grown on the entire surface of the semiconductor substrate 40. The film is thin enough so as not to impede subsequent ion-implantation. The sacrificial oxide film 44 prevents the surface of the semiconductor substrate 40 from being damaged in the subsequent ion-implantation process.

Figure 13:
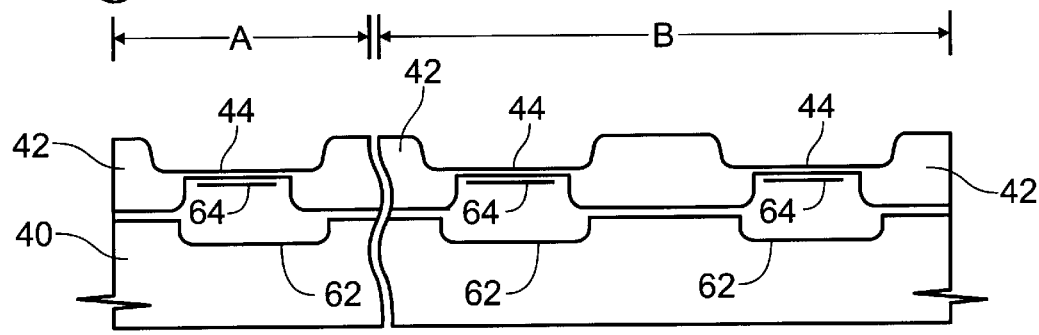

FIG. 13 shows the steps of forming first and second impurity layers 62 and 64. Impurities of P-type conductivity are implanted into the entire surface of the resultant structure shown in FIG. 12 to form a first impurity layer 62. At this time, energy for the ion-implantation should be high enough that the impurities can pass through the field oxide film 42. The first impurity layer 62 in the field region includes a shallow region under the field oxide film 42. However, in the active region, there is no barrier such as the field oxide film 42. Accordingly, the first impurity layer 62 is formed in the active region more deeply than in the field region. The first impurity layer 62 serves as a channel stop. The channel stop by the first impurity layer 62 can be shown in the field region, and, in the active region, the first impurity layer 62 improves punch-through characteristics between the source and drain of a transistor that is to be formed later.

To control the threshold voltage of the NMOS transistor that is to be formed in the active region, impurities of P-type conductivity are implanted into the entire surface of the resultant structure with less energy than that used for forming the first impurity layer 62. As a result, in the active region between the field oxide films 42, the second impurity layer 64 is shallower than the first impurity layer 62. The impurities that are ion-implanted into the field oxide layer do not affect device operation.

Figure 14:
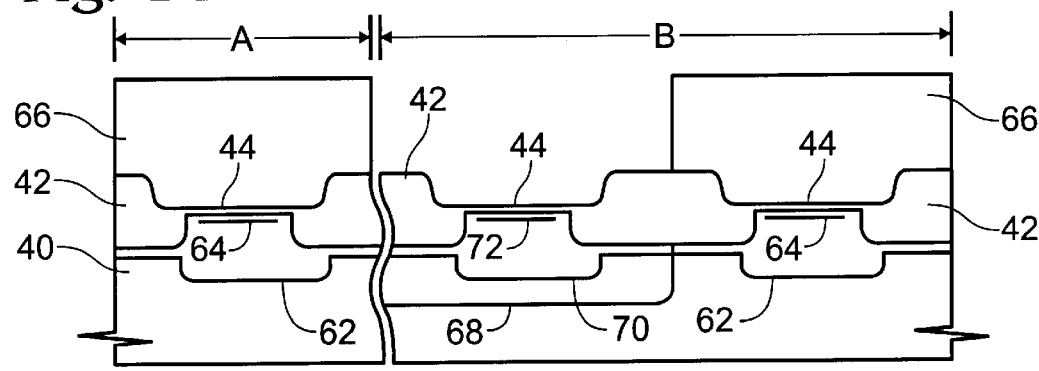

FIG. 14 shows the steps of forming third, fourth and fifth impurity layers 68, 70 and 72 in the PMOS regions. A mask pattern 66 for masking the NMOS regions in the ESD protection circuit region "A" and the peripheral circuit region "B" is formed on the semiconductor substrate 40. Then, impurities of N-type conductivity are implanted into the entire surface of the semiconductor substrate 40 where the mask pattern 66 is formed to form the third impurity layer 68. The third impurity layer 68 is formed deeply in the field region as well as in the active region. Also, impurities of N-type conductivity are implanted into the entire surface of the semiconductor substrate 40 to form a channel stop impurity layer in the PMOS region, to thereby form the fourth impurity layer 70. The fourth impurity layer 70 formed under the field oxide film 42 is also shallow. Since the first impurity layer 62 is originally formed of impurities of N-type conductivity, the dose of impurities of N-type conductivity implanted into the region of the first impurity layer 62 is greater than that of the first impurity layer 62 in other regions to compensate or invert the conductivity type. Also, the fourth impurity layer 70 formed in the active region is deeper than that formed in the field region, but shallower an the third impurity layer 68.

The fifth impurity layer 72 is implanted to about the same depth as the second impurity layer 64. Then, the mask pattern 66 is stripped from the semiconductor substrate 40 and transistors are formed in the active regions in the usual manner.

In a semiconductor device manufactured in accordance with the present invention, an ion-implantation process for forming a P-well in the ESD protection circuit region is not performed. Accordingly, the impurity concentration of a channel region in the ESD protection circuit region is lower than that in prior art as can be seen by comparing FIGS. 15 and 16.

Figure 15:
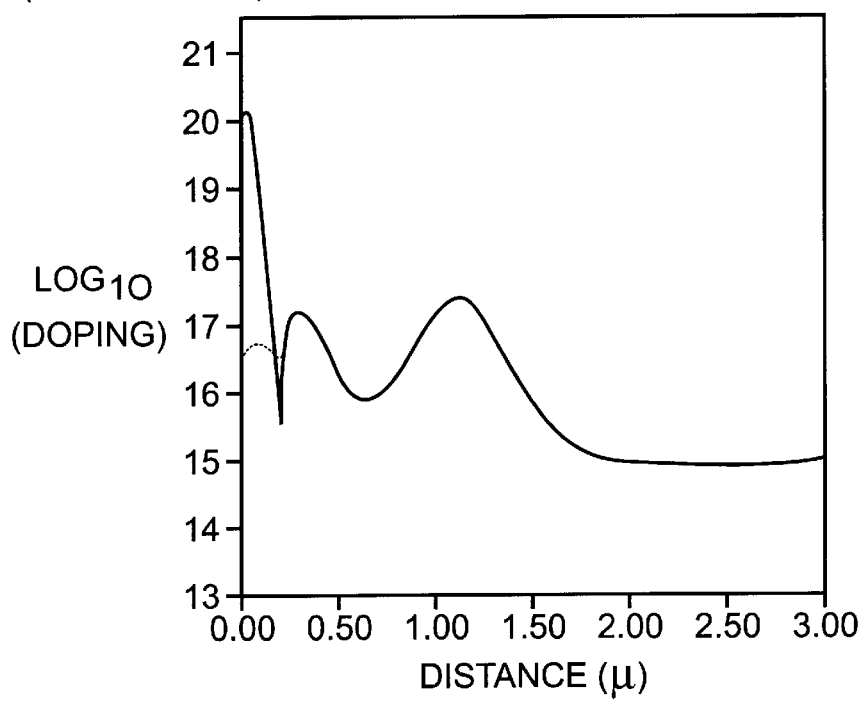
FIG. 15 is a graph showing distribution of well impurities of the ESD protection circuit region of a prior art semiconductor device.

FIG. 15 shows the distribution of well impurities in an ESD protection circuit region in a conventional semiconductor device. The latitudinal axis represents a drain voltage and the longitudinal axis represents doping concentration in common logarithms. The solid curve represents the distribution of impurities in the source and drain and the dotted trace represents the distribution of impurities in the channel region. Referring to FIG. 15, for the P-well, impurities equal to or more than $3 \times 10^{17}$ atoms/cm$^3$ are doped at a depth of around 1.2 $\mu$m from the surface.

Figure 16:
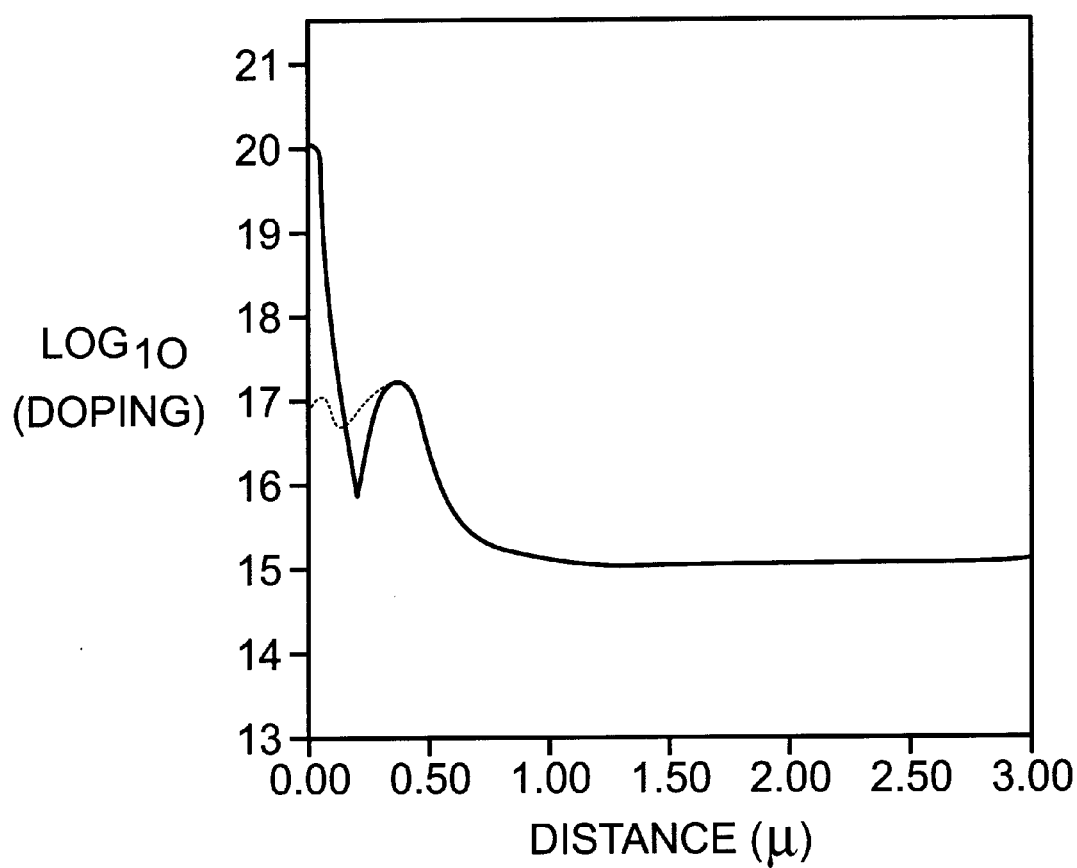
FIG. 16 is a graph showing distribution of well impurities of the ESD protection circuit region of a semiconductor device according to the present invention.

In contrast, FIG. 16 shows the distribution of P-well impurities in the ESD protection circuit region of a device fabricated in accordance with the present invention in which impurities are implanted in the same concentration but shallower than in the prior art. That is, according to the present invention, impurities equal to or more than $3 \times 10^{17}$ atoms/cm$^3$ are distributed at a portion of 0.5 $\mu$m or less from the substrate surface. The concentration of impurities in a deeper region is decreased to $\sim 10^{15}$ atoms/cm$^3$. This is because the ion-implantation process for forming a P-well is omitted. As a result, the well resistance of the ESD protection circuit region according to the present invention is increased by approximately 20% with respect to the conventional art. The increase in the well resistance reduces snapback voltage, as shown in FIG. 17.

Figure 4:
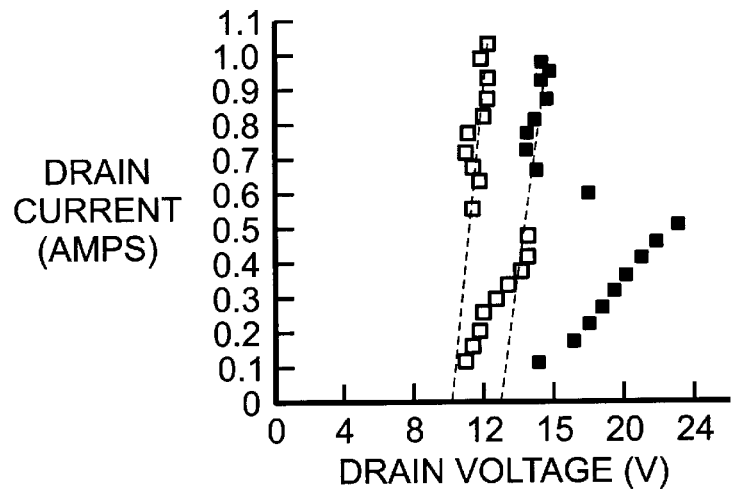
FIG. 4 is a graph showing voltage vs. current characteristics of a drain region depending on doping concentration of a source and a drain region in the prior art compared to a device constructed in accordance with the present invention.
Figure 5:
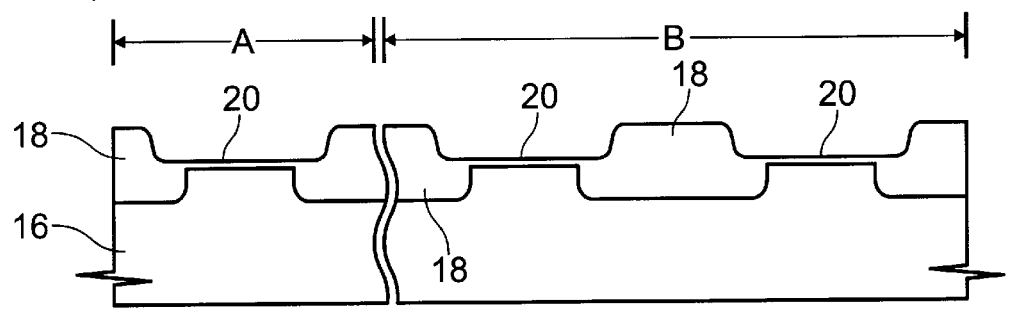
FIGS. 5 through 7 are sectional views showing each step of a prior at method for forming an ESD protection circuit for a conventional semiconductor device.
Figure 6:
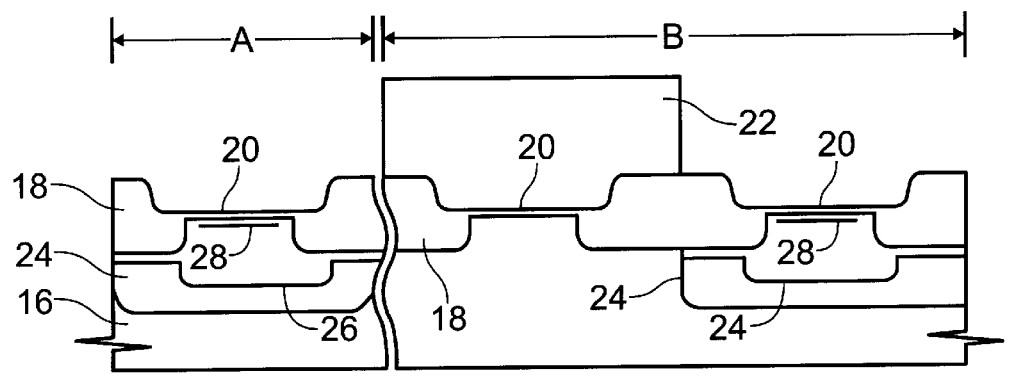
Figure 7:
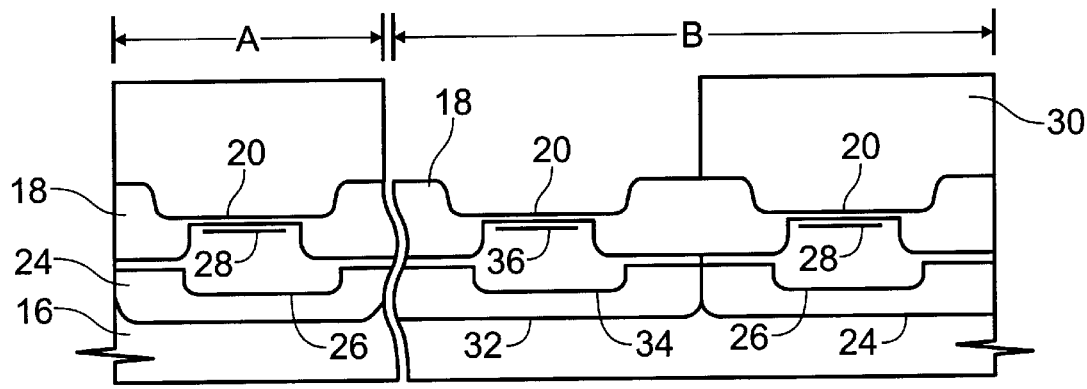
Figure 17:
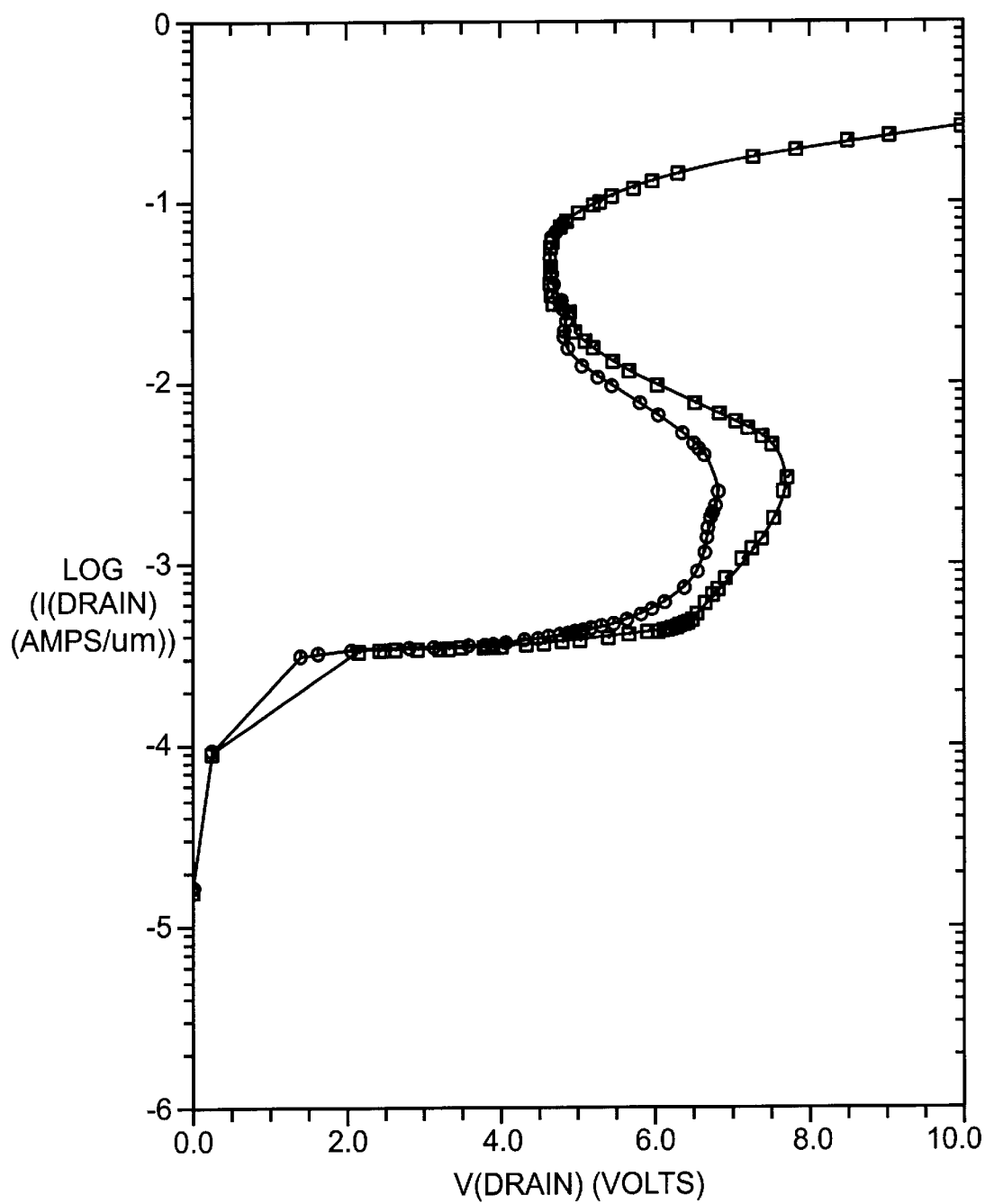
FIG. 17 is a graph comparing snapback voltage properties of ESD protection regions according to the prior art and the present invention.

FIG. 17 is a graph showing the snapback voltage property of the ESD protection regions in a prior art device, and a device fabricated in accordance with the present invention when the gate voltage is 3.5V. In FIG. 17, the latitudinal axis represents drain voltage and the longitudinal axis represents the common logarithm value of drain current. The symbol □ indicates the snapback voltage in the prior art device and the symbol ○ indicates the snapback voltage of a device according to the present invention. Referring to FIG. 7, the conventional snapback voltage is approximately 7.8V, whereas the snapback voltage according to the present invention is approximately 6.8V.

The 20% increased P-well resistance turns on the junction between the source and substrate earlier than in the prior art. This reduces snapback voltage by about 1 volt. This is because the holes stored in a high resistance well increases the forward voltage between the source and substrate in an ESD device of the present invention during the bipolar operation mode. Reduction of the snapback voltage means that the ESD voltage can be increased. Accordingly, the ESD characteristics of the semiconductor device are improved. Also, the method for forming an ESD protection circuit region of the present invention has little effect on the direct current (DC) properties of a transistor, as shown in FIGS. 18 through 21.

Figure 18:
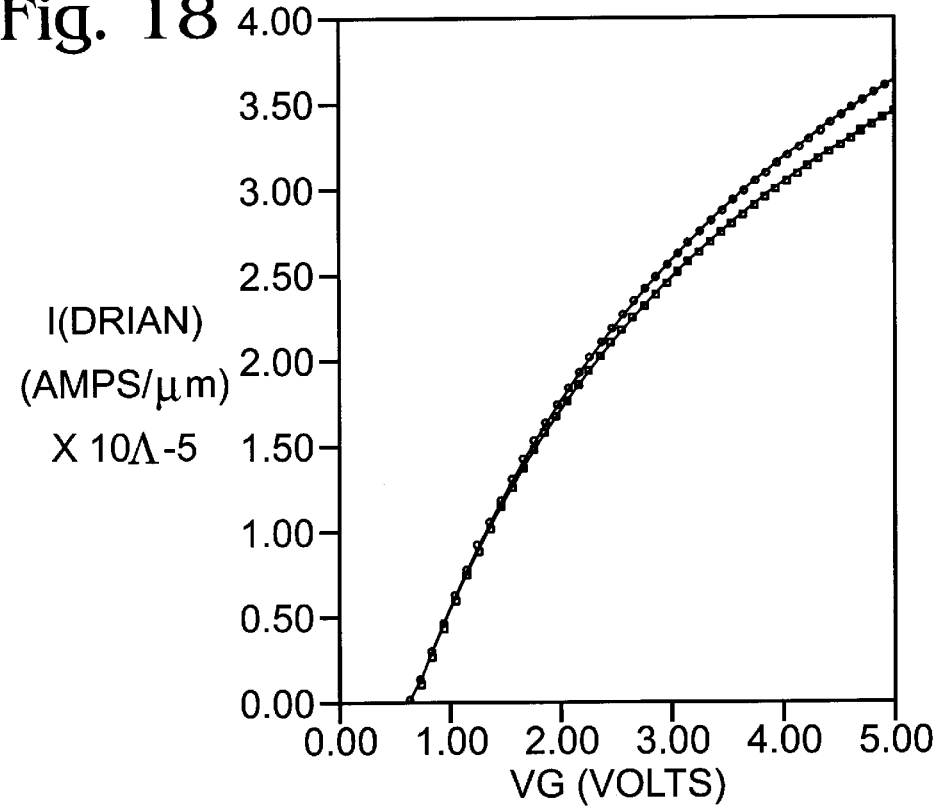
FIG. 18 is a graph comparing threshold voltage properties of devices constructed according to the prior art and the present invention.

FIG. 18 is a graph showing the threshold voltage properties of a prior art device and a device according to the present invention where the latitudinal axis represents the gate voltage and the longitudinal axis represents the drain current. Here, the symbol □ represents the threshold voltage of the prior art device and the symbol ○ represents the threshold voltage of a device according to the present invention. Referring to FIG. 18, when the gate voltage in both a prior at device and a device according to the present invention is approximately 0.6V, the drain current begins to flow.

Figure 19:
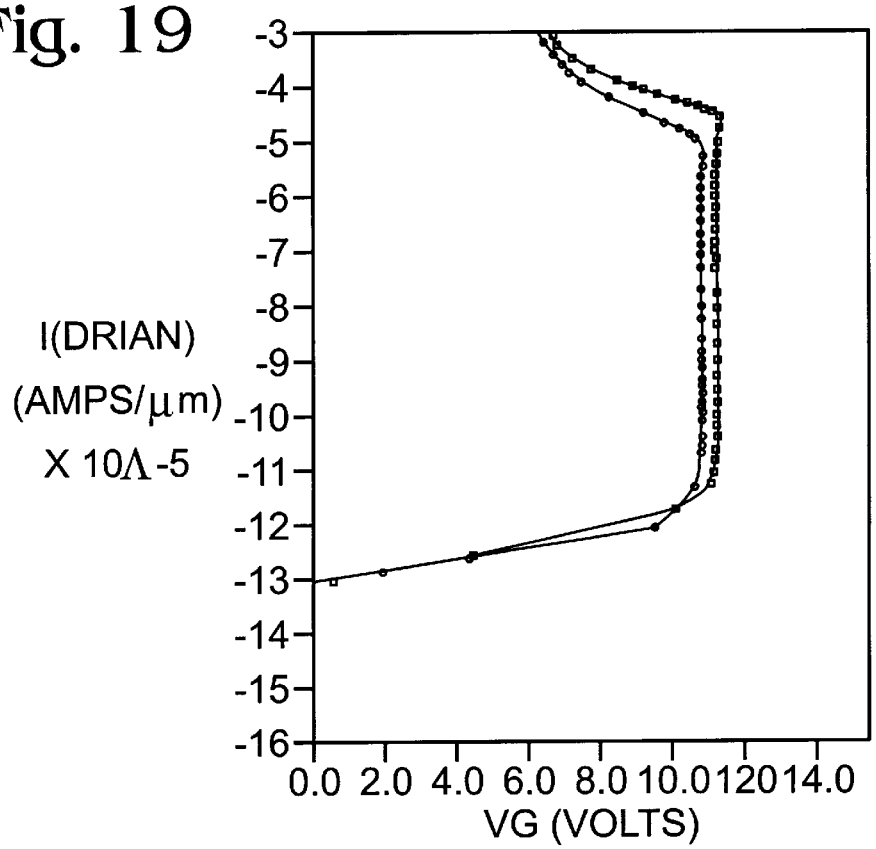
FIG. 19 is a graph comparing break down voltage properties of devices constructed according to the prior art and the present invention.

The breakdown voltage properties between the source and the drain are shown in FIG. 19, where the latitudinal axis represents the drain voltage and the longitudinal axis represents common logarithm values. Here, the symbol □ represents the break down voltage properties of a conventional device and the symbol ○ represents the break down voltage properties of a device according to the present invention. Also, the breakdown voltages in both a prior art device and a device according to the present invention are disposed between 10V and 12V, and the break down voltage according to the present invention is reduced by about 0.1~0.2V compared to the conventional break down voltage.

Figure 20:
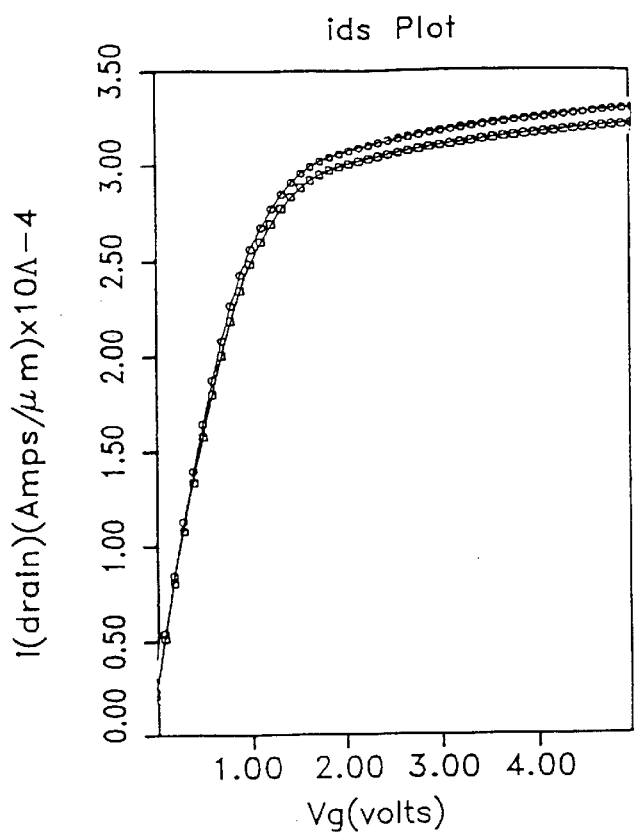
FIG. 20 is a graph comparing saturation current properties of devices constructed according to the prior art and the present invention.

The drain saturation current (Ids) is shown in FIG. 20 where the latitudinal axis represents the drain voltage and the longitudinal axis represents drain current. Here, the symbol □ represents the drain saturation current of a prior art device and the symbol ○ represents the drain saturation current of a device according to the present invention. As the saturation voltage increases, the drain currents are increase. However, when the drain current is between $3.1~3.2 \times 10^{-4}$ ampere (A), the drain current does not increase, regardless of increases in the drain voltage. The values of the drain saturation current in the prior art device and a device according to the present invention are different, but the difference is very small, and thus, there is little influence on the operational characteristics of the transistor.

Figure 21:
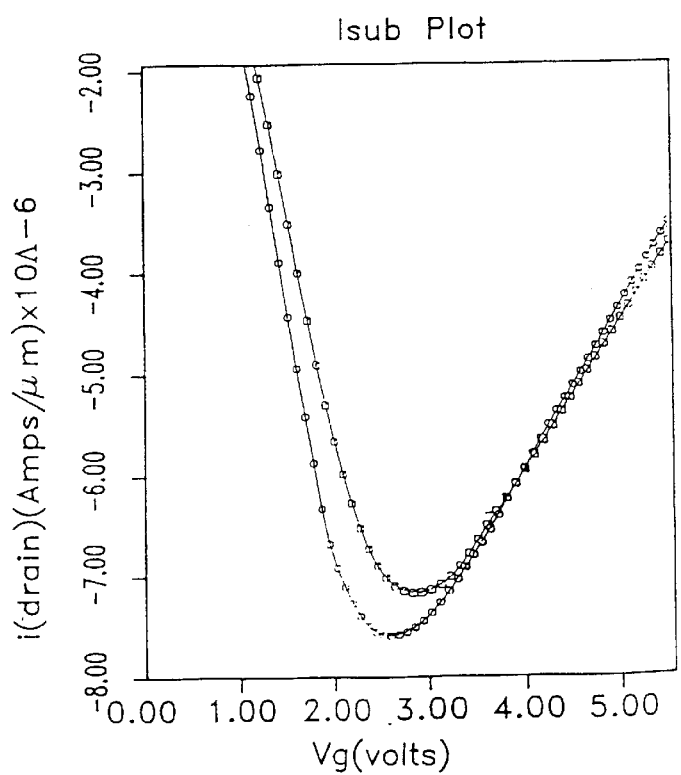
FIG. 21 is a graph comparing substrate current properties of devices constructed according to the prior art and the present invention.

Substrate current properties are shown in FIG. 21 where the gate voltage is indicated on the latitudinal axis and the value of the substrate leakage current is indicated on the longitudinal axis. There, the symbol □ represents the substrate current of a prior art device, and the symbol ○ represents the substrate current of a device according to the present invention. Also, substrate current of both the prior at device and the device according to the present invention are between $7~7.8 \times 10^{-6} A/\mu m$. Usually, in the prior art, an NMOS device is operated on the surface of the semiconductor substrate, and an impurity layer is ion-implanted to form a well in a deep region of the substrate. Accordingly, DC properties of the transistor have little influence when the step of forming the well is omitted.

According to the present invention, during a process of forming an ESD protection circuit region, the ion-implantation to form a well is not performed, thereby lowering the impurity concentration of the well. Accordingly, in the first and second protection circuits of the ESD protection circuit region, increase in resistance of the substrate, and reductions in the leakage current and the snapback voltage can improve the ESD properties.

It should be understood that the invention is not limited to the illustrated embodiment and that many changes and modifications can be made within the scope of the invention by a person skilled in the art.

What is claimed is:

1. A method for manufacturing a semiconductor device on a semiconductor substrate having a circuit region which includes an ESD protection circuit region, the method comprising the steps of:

forming a first impurity layer on a first portion of the circuit region excluding the ESD protection circuit region;

forming a second impurity layer in the circuit region including the ESD protection circuit region for a channel stop having conductive impurities of the same type as the first impurity layer, the second impurity layer being shallower than the first impurity layer;

forming a fourth impurity layer having conductive impurities of a different type from the first impurity layer on a second portion of the circuit region different from both the first portion and the ESD protection circuit region, the fourth impurity layer being deeper than the second impurity layer; and forming a fifth impurity layer in the second portion of the circuit region, the fifth impurity layer overlapping the second impurity layer and having conductive impurities of the same type as the fourth impurity layer, wherein the dose of the fifth impurity layer compensates the second impurity layer.

2. A method according to claim 1 further including forming a third impurity layer having a predetermined thickness on the first portion of the circuit region.

3. A method according to claim 1 further including forming a sixth impurity layer having a predetermined thickness on the second portion of the circuit region.

4. A method according to claim 1 further including forming a field oxide film on the semiconductor substrate to divide the circuit region into a first active region corresponding to the first portion of the circuit region and a second active region corresponding to the second portion of the circuit region.

5. A method according to claim 4 further including forming a buffer oxide film on the surface of the semiconductor substrate over the active regions.

6. A method according to claim 4 further including forming a transistor on the first active region.

7. A method according to claim 1 wherein the first impurity layer is formed by ion-implanting impurities of P-type conductivity.

8. A method according to claim 1 wherein the second impurity layer is formed after the first impurity layer.

9. A method according to claim 1 wherein the first impurity layer is formed after the second impurity layer.

* * * * *

UNITED STATES PATENT AND TRADEMARK OFFICE
CERTIFICATE OF CORRECTION

PATENT NO.    : 5,918,117
DATED         : June 29, 1999
INVENTOR(S)   : Yun

It is certified that error appears in the above-identified patent and that said Letters Patent is hereby corrected as shown below:

Column 1,
Line 58, "proved" should read -- improved --.

Column 8,
Line 6, "an" should read -- than --.
Line 51, "Fig. 7" should read -- Fig. 17 --.

Signed and Sealed this

Twenty-first Day of January, 2003

JAMES E. ROGAN
*Director of the United States Patent and Trademark Office*